US012622304B2

(12) United States Patent
Bayless et al.

(10) Patent No.: US 12,622,304 B2
(45) Date of Patent: May 5, 2026

(54) SEMICONDUCTOR DEVICE ASSEMBLY INTERCONNECTION PILLARS AND ASSOCIATED METHODS

(71) Applicant: Micron Technology, Inc., Boise, ID (US)

(72) Inventors: Andrew M. Bayless, Boise, ID (US); Cassie M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 748 days.

(21) Appl. No.: 17/875,778

(22) Filed: Jul. 28, 2022

(65) Prior Publication Data

US 2024/0038707 A1     Feb. 1, 2024

(51) Int. Cl.
*H01L 23/00* (2006.01)

(52) U.S. Cl.
CPC .............. *H01L 24/16* (2013.01); *H01L 24/13* (2013.01); *H01L 24/81* (2013.01); *H01L 2224/13019* (2013.01); *H01L 2224/13109* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13184* (2013.01); *H01L 2224/13582* (2013.01); *H01L 2224/13609* (2013.01); *H01L 2224/13611* (2013.01); *H01L 2224/13613* (2013.01); *H01L 2224/13618* (2013.01); *H01L 2224/1362* (2013.01); *H01L 2224/13639* (2013.01); *H01L 2224/13647* (2013.01); *H01L 2224/1369* (2013.01); *H01L 2224/16145* (2013.01); *H01L 2224/81815* (2013.01)

(58) Field of Classification Search
CPC . H01L 2224/13019; H01L 2224/16145; H01L 2224/13582; H01L 2224/02166
See application file for complete search history.

(56) References Cited

U.S. PATENT DOCUMENTS

| | | | | |
|---|---|---|---|---|
| 2,330,062 A | * | 9/1943 | Lempert | .............. B23K 35/302 |
| | | | | 420/497 |
| 2011/0291262 A1 | * | 12/2011 | Shen | ........................ H01L 24/13 |
| | | | | 257/737 |
| 2021/0280542 A1 | * | 9/2021 | Baloglu | ................... H01L 24/81 |

* cited by examiner

*Primary Examiner* — Wael M Fahmy
*Assistant Examiner* — Fernando Jose Ramos-Diaz
(74) *Attorney, Agent, or Firm* — Dorsey & Whitney LLP

(57) ABSTRACT

In some embodiments, an interconnection structure can electrically and physically couple a first semiconductor die and a second semiconductor die. The interconnection structure can include a first portion at the first semiconductor die and a second portion at the second semiconductor die. The first portion can include a first conductive pillar with a concave bonding surface, a first annular barrier layer, and a first annular solder layer. The first annular barrier layer can surround a sidewall of the first conductive pillar, and the first annular solder layer can surround the first barrier layer. The second portion can include a second conductive pillar having a convex bonding surface, the convex bonding surface coupled to the concave bonding surface. The second interconnection structure can further include a second annular solder layer surrounding a second annular barrier layer surrounding the second conductive pillar.

20 Claims, 11 Drawing Sheets

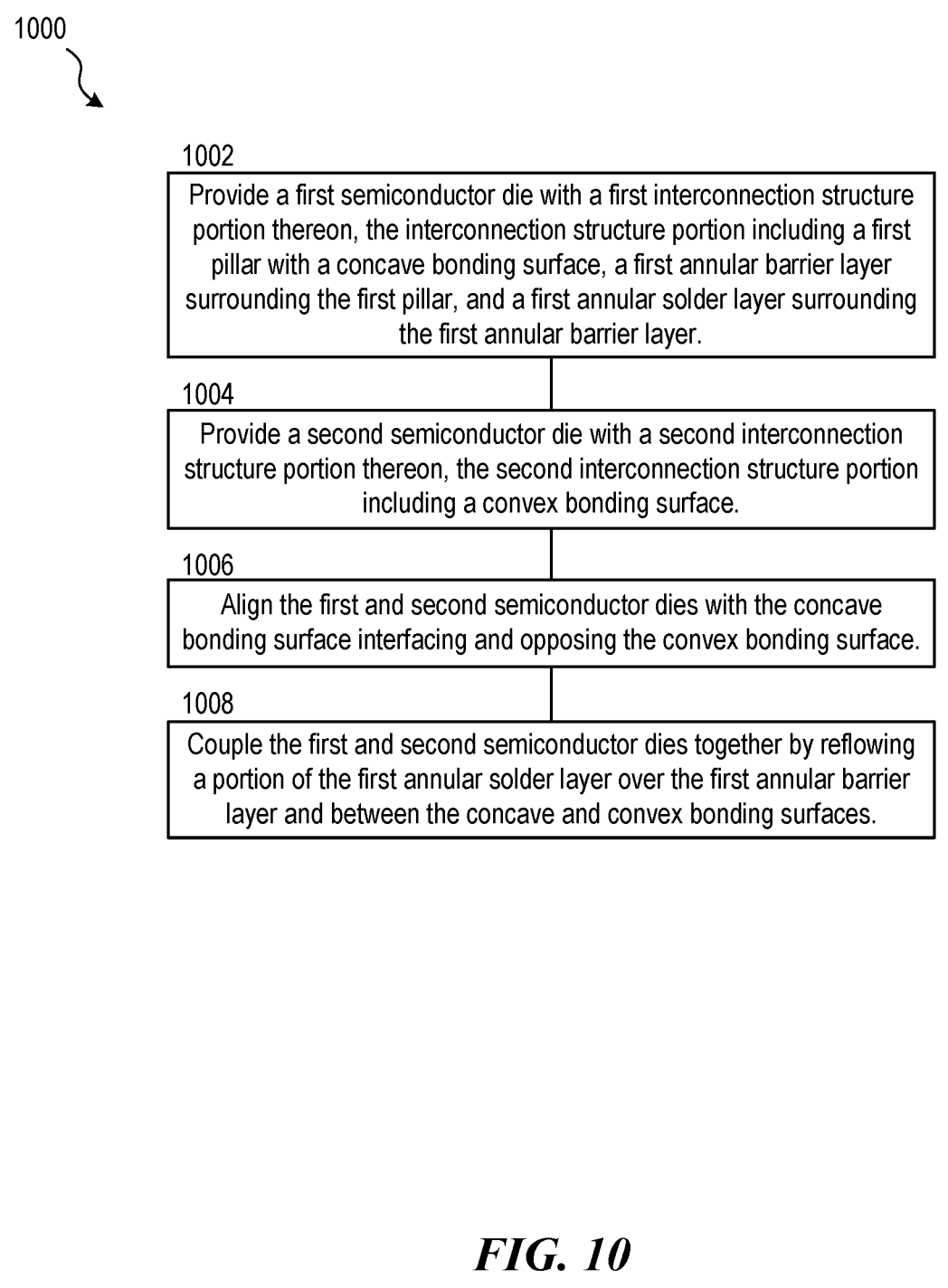

1000

1002

Provide a first semiconductor die with a first interconnection structure portion thereon, the interconnection structure portion including a first pillar with a concave bonding surface, a first annular barrier layer surrounding the first pillar, and a first annular solder layer surrounding the first annular barrier layer.

1004

Provide a second semiconductor die with a second interconnection structure portion thereon, the second interconnection structure portion including a convex bonding surface.

1006

Align the first and second semiconductor dies with the concave bonding surface interfacing and opposing the convex bonding surface.

1008

Couple the first and second semiconductor dies together by reflowing a portion of the first annular solder layer over the first annular barrier layer and between the concave and convex bonding surfaces.

*FIG. 10*

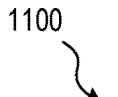
1100
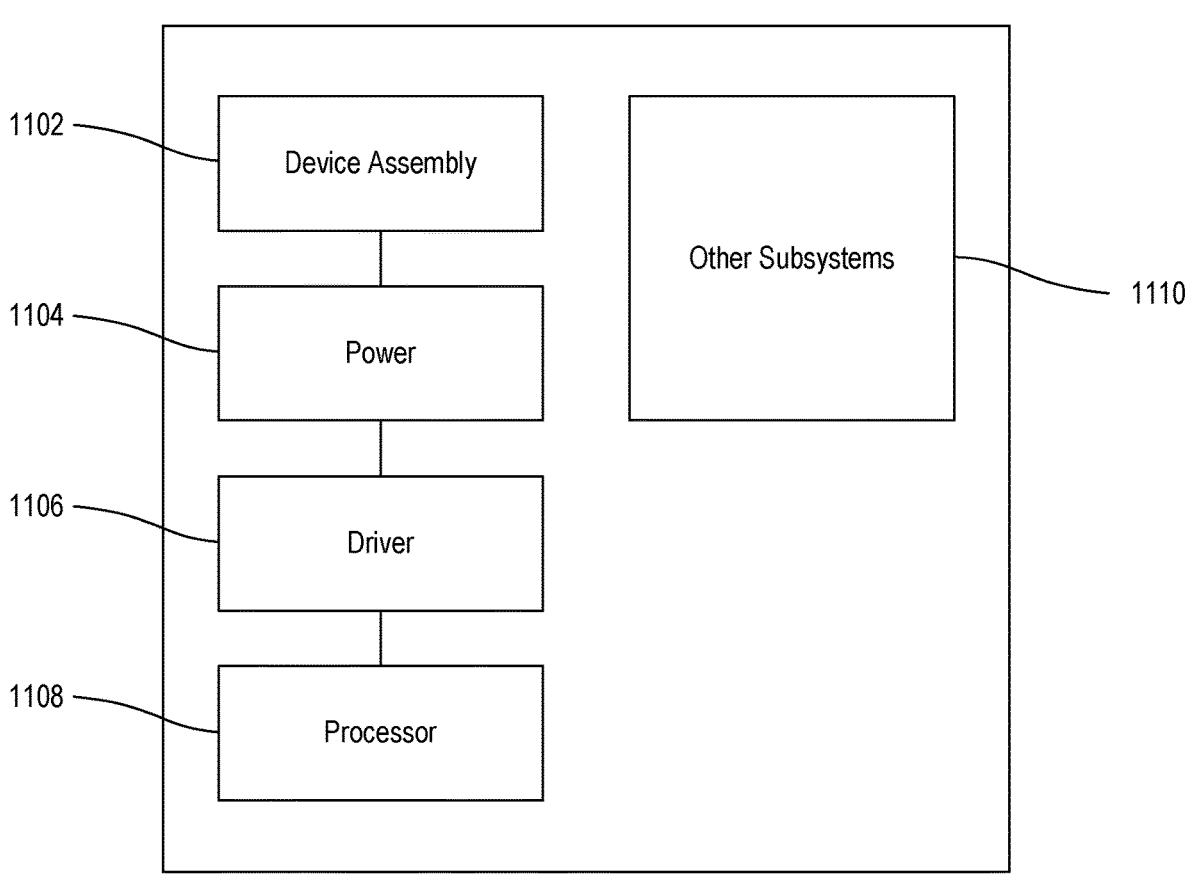
1102 — Device Assembly
1104 — Power
1106 — Driver
1108 — Processor
Other Subsystems — 1110
*FIG. 11*

SEMICONDUCTOR DEVICE ASSEMBLY INTERCONNECTION PILLARS AND ASSOCIATED METHODS

TECHNICAL FIELD

The present disclosure is generally related to semiconductor device assembly interconnection structures. In particular, the present technology relates to interconnection pillars having solder on one or more lateral exterior surfaces thereof.

BACKGROUND

Microelectronic devices, such as memory devices and microprocessors, and other electronics typically include one or more semiconductor devices and/or components attached to one or more of a substrate, another semiconductor device, and/or component encased in a protective covering. The devices and/or components include at least one functional feature, such as memory cells, processor circuits, and/or interconnecting circuitry, etc. Each device and/or component commonly includes an array of small bond pads electrically coupled to the functional features therein for interconnection with other devices and/or components.

In some applications, these bond pads interconnect with other device and/or components using metallic interconnection pillars, such as copper pillars. These pillars provide both a physical and an electrical coupling between the device and/or components they connect. Because manufacturers are under increasing pressure to reduce the space occupied by assemblies having these devices and components, while simultaneously increasing their capacity and/or speed of operation, interconnection pillars must be increasingly small while still providing sufficient physical strength and current carrying capacity.

BRIEF DESCRIPTION OF THE DRAWINGS

FIG. 10 is a flow diagram illustrating a process for producing a semiconductor device assembly, in accordance with some embodiments of the present technology.

FIG. 11 is a schematic diagram illustrating a semiconductor device assembly incorporating the present technology, configured in accordance with some embodiments of the present technology.

Figure 1:
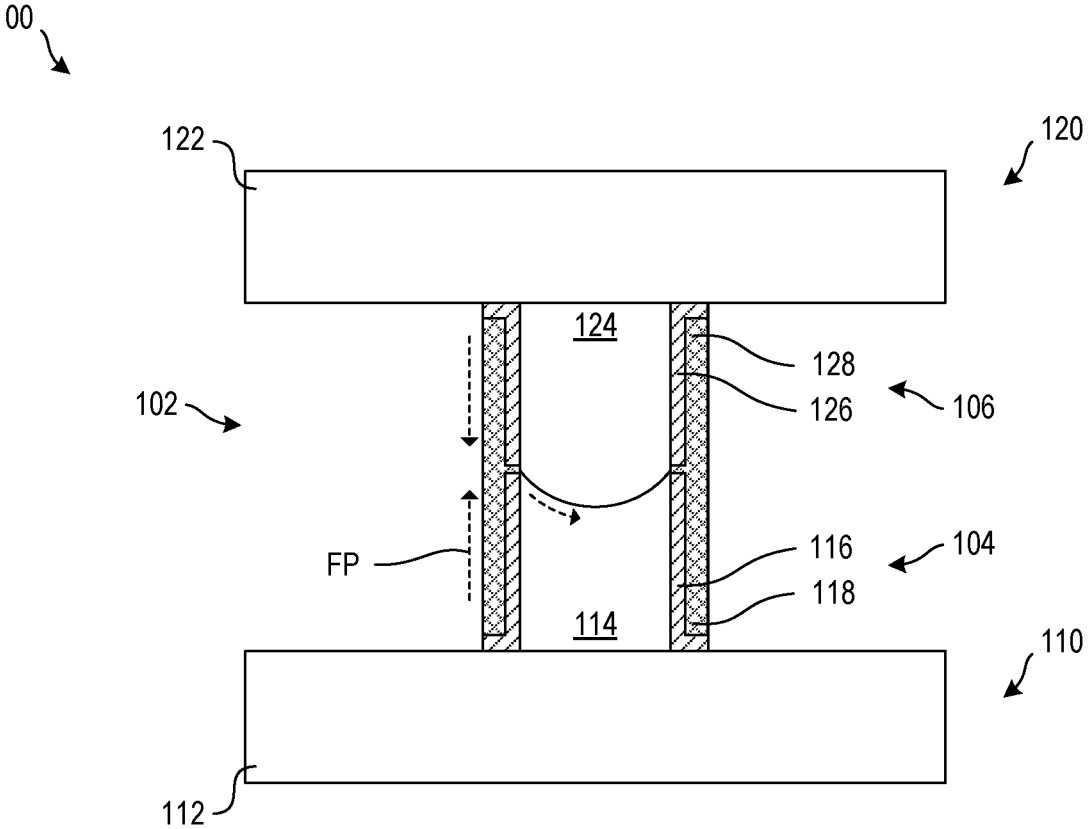
FIG. 1 is a cross sectional side view of a semiconductor device assembly, configured in accordance with some embodiments of the present technology.

The drawings have not necessarily been drawn to scale. Similarly, some components or operations can be separated into different components or combined into a single assembly in some implementations of the present technology. While the technology is amenable to various modifications and alternative forms, specific implementations have been shown by way of example in the drawings and are described in detail below.

DETAILED DESCRIPTION

When traditional interconnection pillars are formed, solder material is provided between opposing surfaces of interconnection pillar portions. When the solder material is heated to bond the pillar portions together, the solder material can be drawn to the edges of the surfaces, producing voids (e.g., pockets, openings, inconsistencies) near the surfaces' centers and/or throughout the solder. These voids can increase bond failure risk and/or reduce interconnection performance by, for example, decreasing bond strength and/or increasing resistance. Voids can further exacerbate these risks by pushing solder to the exterior surfaces of the pillars during assembly temperature cycling, reducing the physical and electrical integrity of the connect between pillars and devices.

The devices and methods of the present technology relate to semiconductor device assemblies including interconnection structures (e.g., interconnection pillars) with outside solder for improving device interconnection integrity and reliability. A completed interconnection structure can include a first portion connected to a first device and having a first pillar with a bonding surface excluding solder material, and can also include a second portion connected to a second device and having a second pillar with a bonding surface excluding solder material. Either or both of the first and second interconnection structure portions can include solder material forming an outside surface (e.g., sidewall, side surface, exterior wall) thereof. To assemble the first and second devices together, the bonding surfaces of the first and second pillars can be aligned. Then, the solder material forming the exterior of the first and/or second interconnection structure portions can flow from the outside thereof to between the bonding surfaces, completing the interconnection structure (e.g., bonding the first and second portions together) and coupling the first and second device together.

By including solder material on the outside of the first and second interconnection structure portions, and by excluding—before assembly—solder material on the bonding surfaces thereof, embodiments of the present technology can provide improvements over traditional interconnection structures of semiconductor device assemblies. For example, embodiments of the present technology can reduce or eliminate solder and/or intermetallic voiding between device pillars, or similar structures, of assembled semiconductor devices. Similarly, solder squeeze-out from between pillars or similar structures (e.g., solder exiting from between pillars and wrapping round the edges thereof) can be reduced or eliminated for the same reason.

Furthermore, embodiments of the present technology can alleviate semiconductor device assembly issues related to assembly and/or sub-component height as well as interconnection structure width (e.g., diameter). Regarding height, for example, device assembly height controls can be less critical while a device assembly height can be more accurately regulated. Similarly, device pillar heights can have a greater acceptance window because stacked devices can interface at the tallest pillar pairs, and gaps between pillar pairs can fill with solder material. Regarding width, the present technology can allow for more narrow interconnection structures, versus traditional interconnection structures.

In some embodiments, a semiconductor device assembly including interconnection structures with outside solder can include a first semiconductor die, a second semiconductor die, and an interconnection structure directly electrically coupling the first and the second semiconductor dies together. The interconnection structure can include a first portion at the first semiconductor die and a second portion at the second semiconductor die. The first interconnection structure portion can include a first conductive pillar with a concave bonding surface, a first annular barrier layer, and a first annular solder layer. The first annular barrier layer can surround a sidewall of the first conductive pillar, and the first annular solder layer can surround the first barrier layer. The second interconnection structure portion can include a second conductive pillar having a convex bonding surface, with the convex bonding surface coupled to the concave bonding surface. In some embodiments, the second interconnection structure can further include a second annular barrier layer surrounding a sidewall of the second conductive pillar, and a second annular solder layer surrounding the second annular barrier layer.

In some embodiments, a semiconductor device can include a portion of an interconnection structure with outside solder. In these embodiments, the semiconductor device can include a semiconductor substrate and an interconnection structure extending therefrom. The interconnection structure can include a conductive pillar having a curved bonding surface opposite the semiconductor substrate. The interconnection structure can also include an annular barrier layer surrounding a sidewall of the conductive pillar and an annular solder layer surrounding the annular barrier layer. In these embodiments, the curved bonding surface can be substantially free of solder material and can be concave or convex.

The semiconductor device assembly can be manufactured by preparing the first semiconductor die with a first interconnection structure portion thereon. The first interconnection structure can include the first pillar with the concave bonding surface, the first annular barrier layer, and the first annular solder layer. The second semiconductor die can be prepared with the second interconnection structure portion thereon, with the second interconnection structure including the convex bonding surface. The first and second semiconductor dies can be aligned with the concave bonding surface interfacing and opposing the convex bonding surface. Then, the first and second semiconductor dies can be coupled together by flowing a portion of the first annular solder layer over the first annular barrier layer and between the concave and convex bonding surfaces.

In some embodiments, the second semiconductor die can further include the second conductive pillar having the convex bonding surface, the second annular barrier layer surrounding the first pillar, and the second annular solder layer surrounding the second annular barrier layer. In these embodiments, coupling can further include flowing a portion of the second annular solder layer over the second annular barrier layer and between the concave and convex bonding surfaces.

For ease of reference, the semiconductor device and other components are sometimes described herein with reference to top, bottom, left, right, lateral, vertical, uppermost, lowermost or other similar directional terms relative to the spatial orientation of the embodiments described and/or shown in the figures. The semiconductor devices described herein and modifications thereof can be moved to and/or used in different spatial orientations without changing the structure and/or function of the disclosed embodiments of the present technology.

FIG. 1 is a cross sectional side view of a semiconductor device assembly 100 including an interconnection structure 102 (e.g., interconnection pillar) with outside solder material, configured in accordance with some embodiments of the present technology. As shown in FIG. 1, the assembly 100 can include a first semiconductor device 110 (e.g., a semiconductor die, a device substrate) and a second semiconductor device 120 directly physically and electrically coupled by the interconnection structure 102. The interconnection structure 102 can include a first interconnection structure portion 104 (e.g., an interconnection structure) with a first pillar 114 (e.g., a first segment, a bottom/top portion) coupled to the first device 110, and a second interconnection structure portion 106 with a second pillar 124 (e.g., a second segment, a top/bottom portion) coupled to the second device 120. A first barrier layer 116 (e.g., a first annular barrier layer) can surround the first pillar 114, and a first solder layer 118 (e.g., a first portion of the outside solder material, a first annular solder layer) can surround the first annular barrier layer 116. A second barrier layer 126 (e.g., a second annular barrier layer) can surround the second pillar 124, and a second solder layer 128 (e.g., a second portion of the outside solder material, a second annular solder layer) can surround the second annular barrier layer 126.

When the first device 110 and the second device 120 are coupled together (e.g., during an assembly process), portions of the first and/or second annular solder layers 118, 128 can follow a flow path (e.g., FP) vertically and/or laterally inward toward the interface of the first and second pillars 114, 124 (e.g., toward a vertical center of the interconnection structure 102 and/or over the first and second annular barrier layers 116, 126). The portions of the first and/or second annular solder layers 118, 128 can further flow between the first and second pillars 114, 124 (e.g., toward a lateral center of the first and second pillars 114, 124), forming a bond between the first and second interconnection structure portions 104, 106 and coupling the first and second devices 110, 120 together.

By including solder material on the outside of the first interconnection structure portion 104 and/or the second interconnection structure portion 106, and by excluding— before assembly— solder material between the first and second pillars 114, 124, embodiments of the present technology can provide improvements over traditional interconnection pillars of semiconductor device assemblies. For example, including the interconnection structure 102, or another embodiment thereof, can reduce or eliminate solder and/or intermetallic voiding between pillars, or similar structures, of coupled semiconductor devices. Generally, voiding occurs in part due to fluid properties (e.g., due to capillary effects) of the solder pulling solder material away from a center of the pillar bonding surfaces. The interconnection structure 102 can reverse these outcomes by drawing the solder material toward the center of the pillar bonding surfaces. Similarly, solder squeeze-out from between pillars or similar structures can be reduced or eliminated for the same reason.

Furthermore, including the interconnection structure 102, or another embodiment thereof, can alleviate semiconductor device assembly issues related to assembly and/or subcomponent height as well as interconnection structure width. For example, regarding height, device assembly height controls can be less critical while a device assembly height can be more accurate. Height controls can be less critical, and assembly height more accurate, because devices stacked for assembly interface directly at bonding surfaces of the first and second pillars 114, 124, as opposed to being partially separated by solder therebetween. Therefore, stacked devices interface at surfaces with a higher density and/or rigidity than solder, requiring less controls' precision and achieving more accurate assembly height. Similarly, pillar heights can have a greater acceptance window (e.g., pillar height mis-match throughout a device can be greater) because stacked devices can interface at the tallest pillar pairs to secure the assembly, and solder material can flow to fill gaps between pillar pairs.

As a further example, regarding width, the width (e.g., diameter) of the interconnection structure 102 can be less (e.g., more narrow) than the width of traditional interconnection structures. The interconnection structure 102 can be more narrow at least because voiding can be reduced or eliminated, therefore additional surface area of traditional interconnection structures for compensating for voiding can be eliminated. These narrow interconnection structures can provide the benefit of reduced material used for assembly interconnection structures, as well as reduced device surface space occupied thereby and/or the size of necessary BEOL layers thereunder.

As shown in FIG. 1, the assembly 100 can include the first device 110 and the second device 120 coupled by the interconnection structure 102. The first device 110 and the second device 120 can each individually be a memory and/or a processing device, such as a memory die, a graphics processing unit, a logic device, or any similar semiconductor device. The first device 110 and the second device 120 can include a semiconductor substrate 112, 122 with one or more bond pads on one or more surfaces thereof. The interconnection structure 102 can include a first portion 104 and a second portion 106 respectively coupled to the first device 110 and the second device 120 at opposing bond pads thereof. Further, components on or within the first device 110 and the second device 120 can electrically communicate via the interconnection structure 102.

Although as illustrated, the assembly 100 includes one interconnection structure 102, in some embodiments, the first device 110 and the second device 120 each can include additional interconnection structures 102 therebetween (e.g., the assembly 100 can include one or more additional interconnection structures 102). Similarly, the assembly 100 can include one or more additional devices similar to, or the same as, the first and second devices 110, 120. One or more interconnection structures 102 can couple the one or more additional devices to the assembly 100 above and/or below the first or second devices 110, 120.

The first interconnection structure portion 104 can include a first pillar 114 (e.g., a conductive column) having a first diameter and extending from the substrate 112 of the first device 110. For example, the first pillar 114 can have a diameter between 0.05 μm and 50 μm, inclusive; and the first pillar 114 can extend from the substrate 112 between 5 μm and 500 μm, inclusive. The first pillar 114 can include a bonding (e.g., top/bottom, upper/lower) surface opposite the substrate 112 and an outer (e.g., lateral, side) surface between the substrate 112 and the bonding surface. The bonding surface can have a concave shape with a lowermost portion 1 μm, 5 μm, 10 or 20 μm (or any specific value or range outside or therebetween) below an edge (e.g., lip, exterior) of the bonding surface. Further, the bonding surface can have a radius of curvature between 0.25 and 100 inclusive. In some embodiments, the bonding surface can instead have a convex shape.

Shallow versus deep bonding surfaces, as a function of the lowermost point and/or the radius of curvature of the surface of the first pillar 114, in combination with the corresponding characteristics of the opposing bonding surface of the second pillar 124 (e.g., the uppermost point and/or the radius of curvature), provide the technical benefit of increased (or reduced) capillary effect acting on the solder material from the first and/or second annular solder layers 118, 128. For example, if the combination of opposing bonding surfaces provides a more narrow gap therebetween, the capillary effect on the solder material can be increased, more strongly drawing the solder material to the centers of the bonding surfaces. However, this benefit is offset by the composition of the solder material. That is, for example, the capillary effect on solder materials with certain compositions (e.g., having a viscous consistency) can be less effective at drawing the solder material toward the center of the bonding surfaces. Therefore, in these circumstances, a wider gap between the bonding surfaces can similarly provide the technical benefit of more effective capillary effect drawing the solder material toward the center of the bonding surfaces.

A first annular barrier layer 116 can extend from the substrate 112 and can have a top surface at (e.g., level with, planar with) the bonding surface edge. The first annular barrier layer 116 can include an inner surface surrounding and/or bonding with the outer surface of the first pillar 114, and can include an outer surface opposing the inner surface. The first annular barrier layer 116 can have a thickness between the inner surface and the outer surface between 0 (e.g., when excluded) and 4 μm, inclusive.

Including a thicker first annular barrier layer 116 can provide the technical benefit of further separating the first annular solder layer 118 from the first pillar 114, reducing (or preventing) the formation of pillar-solder intermetallics (e.g., between the pillar 114 and the first annular solder layer 118) before coupling the first device 110 and the second device 120 together. The thicker first annular barrier layer 116 can also provide additional support (e.g., structural, lateral support) for the first pillar 114. Including a thinner first annular barrier layer 116 can provide the technical benefit of reducing overall material used within the assembly, thereby reducing material costs. The thinner first annular barrier layer 116 can also reduce the distance traveled by the solder material from the first annular solder layer 118 to between the bonding surfaces of the first and the second pillars 114, 124 (e.g., over the annular barrier layer), thereby reducing the amount of solder material needed in the first annular solder layer 118 (e.g., allowing a thinner annular solder layer 118).

In some embodiments, the first annular barrier layer 116 can extend 1 μm, 5 μm, 10 μm or 20 μm, (or any specific value or range outside or therebetween) above or below the bonding surface edge. Providing the first annular barrier layer 116 extending above the boding surface edge can provide the technical benefit of reducing (or preventing) the formation of pillar-solder intermetallics before coupling the first device 110 and the second device 120 together. The taller annular barrier layer 116 can also help align the first and the second interconnection structure portions 104, 106 during assembly of the first and the second devices 110, 120, with the top of the annular barrier layer 116 acting as a guide for the opposing second interconnection structure portion 106. Providing the first annular barrier layer 116 extending below the boding surface edge can provide the technical benefit of reducing the distance traveled by the solder material from the first annular solder layer 118 to between the bonding surfaces of the first and the second pillars 114, 124, thereby reducing the amount of solder material needed in the first annular solder layer 118.

A first annular solder layer 118 can extend from a flange of the first annular barrier layer 116 at the substrate 112, or can extend from the substrate 112 (e.g., when the first annular barrier layer 116 flange is excluded). The first annular solder layer 118 can include an inner surface surrounding and/or bonded to the outer surface of the first annular barrier layer 116. The first annular solder layer 118 can include an outer surface opposing the inner surface and forming an outer surface of the first interconnection structure portion 104. The first annular solder layer 118 can have a thickness between the inner surface and the outer surface between 0 when excluded, or 50 nm and 10 μm, inclusive. In some embodiments, the first annular barrier layer 116 and/or the first annular solder layer 118 can be excluded. For example, the first interconnection structure portion 104 can merely include the first pillar 114 with the concave or convex bonding surface.

Including a thicker first annular solder layer 118 can provide the technical benefit of increased success rate (e.g., yield rate) for assembling the first and the second interconnection structure portions 104, 106 together. Success rate can be increased because including more solder material can increase the likelihood of sufficient amounts of solder material flowing between the bonding surfaces of the first and the second pillars 114, 124 to form the interconnection therebetween, and to reduce or prevent voiding. Further, including the thicker first annular solder layer 118 can reduce (or eliminate) the need for solder material within the second annular solder layer 128. Including a thinner first annular solder layer 118 can provide the technical benefit of reducing overall material used within the assembly, reducing material costs. Further, the thinner first annular solder layer 118 can reduce the overall width of the first interconnection structure portion 104, thereby reducing the surface space of the first device 110 occupied thereby, and/or allowing for a greater density of the first interconnection structure portions 104 on the surface of the first device 110.

The second interconnection structure 106 can include a second pillar 124 having a second diameter and extending from the substrate 122 of the second device 120. For example, the second pillar 124 can have a diameter between 0.05 μm and 50 μm, inclusive; and the second pillar 124 can extend from the substrate 122 between 5 μm and 500 μm, inclusive. The second pillar 124 can include a bonding (e.g., bottom/top, lower/upper) surface opposite the substrate 122 and an outer (e.g., lateral, side) surface between the substrate 122 and the bonding surface. The bonding surface can have a convex shape with an uppermost portion 1 μm, 5 μm, 10 or 20 μm (or any specific value or range outside or therebetween) above an edge of the bonding surface. Further, the bonding surface can have a radius of curvature between 0.25 μm and 100 μm, inclusive.

A second annular barrier layer 126 can extend from the substrate 122 and can have a top surface at the bonding surface edge. The second annular barrier layer 126 can include an inner surface surrounding and/or bonding with the outer surface of the second pillar 124, and can include an outer surface opposing the inner surface. The second annular barrier layer 126 can have a thickness between the inner surface and the outer surface between 0 μm and 4 μm, inclusive.] In some embodiments, the second annular barrier layer 126 can extend 1 μm, 5 μm, 10 or 20 μm (or any specific value or range outside or therebetween) above or below the bonding surface edge. Including a thicker or thinner second annular barrier layer 126 and/or providing the second annular barrier layer 126 extending above or below the bonding surface edge can provide the same and/or similar technical benefits as the similar characteristics of the first annular barrier layer 116.

A second annular solder layer 128 can extend from a flange of the second annular barrier layer 126 at the substrate 122, or can extend from the substrate 122 (e.g., when the second annular barrier layer 126 flange is excluded), and can include an inner surface surrounding and/or bonded to the outer surface of the second annular barrier layer 126. The second annular solder layer 128 can include an outer surface opposing the inner surface and forming an outer surface of the second interconnection structure portion 106. The second annular solder layer 128 can have a thickness between the inner surface and the outer surface between 0 when excluded, or 50 nm and 10 μm, inclusive. In some embodiments, the second annular barrier layer 126 and/or the second annular solder layer 128 can be excluded. For example, the second interconnection structure portion 106 can merely include the second pillar 124 with the convex bonding surface. Including a thicker or thinner second annular solder layer 128 can provide the same and/or similar technical benefits as the similar characteristics of the first annular solder layer 118.

In FIG. 1, the interconnection structure 102 is completed (e.g., the first and second interconnection structure portions 104, 106 are bonded together). As shown, the first and second annular solder layers 118, 128 extend over the first and second annular barrier layers 116, 126, respectively, and between the first and second pillars 114, 124. In some embodiments, at least a portion of the first and/or the second annular solder layers 118, 128 can extend between the first and second pillars 114, 124 and across the entirety of the bonding surfaces thereof. In some embodiments, at least a portion of the first and/or the second annular solder layers 118, 128 can extend between the first and second pillars 114, 124 and across a portion of the bonding surfaces thereof (e.g., near a vertical centerline of the interconnection structure 102, near the edges of the bonding surfaces, certain regions of the bonding surfaces, etc.). In some embodiments, the first annular solder layer 118 can at least extend between a first portion of the bonding surfaces and the second annular solder layer 128 can at least extend between a second portion of the bonding surfaces, different than the first portion.

The solder material between the bonding surfaces of the first and second pillars 114, 124 can form an intermetallic material therebetween. The intermetallic material can be between and/or within top portions of the first and the second pillars 114, 124 (e.g., at the bonding surfaces), and can extend across the entirety of the interface between the bonding surfaces. In some embodiments, the intermetallic material can correspond with the location of the solder material between the bonding surfaces. In some embodiments, the intermetallic material can extend over only portions of the interface between the bonding surfaces. For example, the intermetallic material can be proximate the bonding surface edges. That is, the interconnection structure 102 can exclude an intermetallic material along the vertical centerline (e.g., axis) thereof. Alternatively, for example, the intermetallic material can be proximate the interface between the lowermost portion of the concave bonding surface and the uppermost portion of the convex bonding surface. That is, the interconnection structure 102 can exclude an intermetallic material near the edges of the bonding surfaces.

Figure 8A:
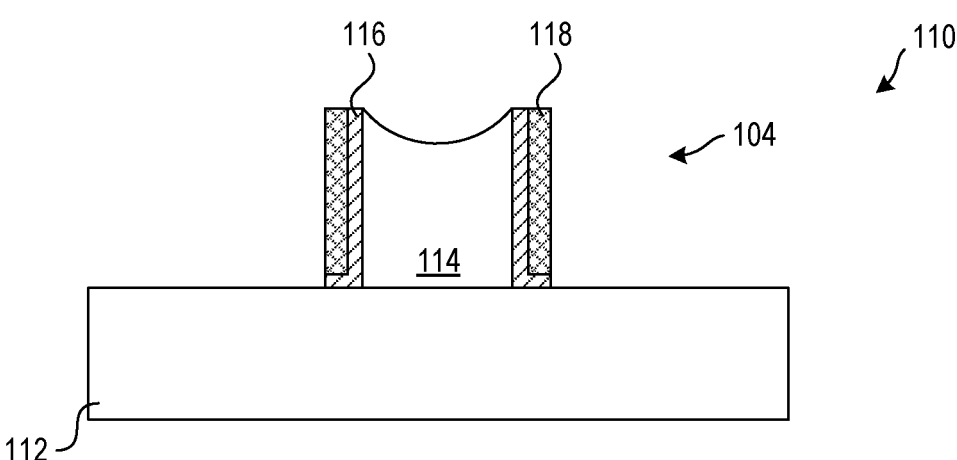
Figure 8B:
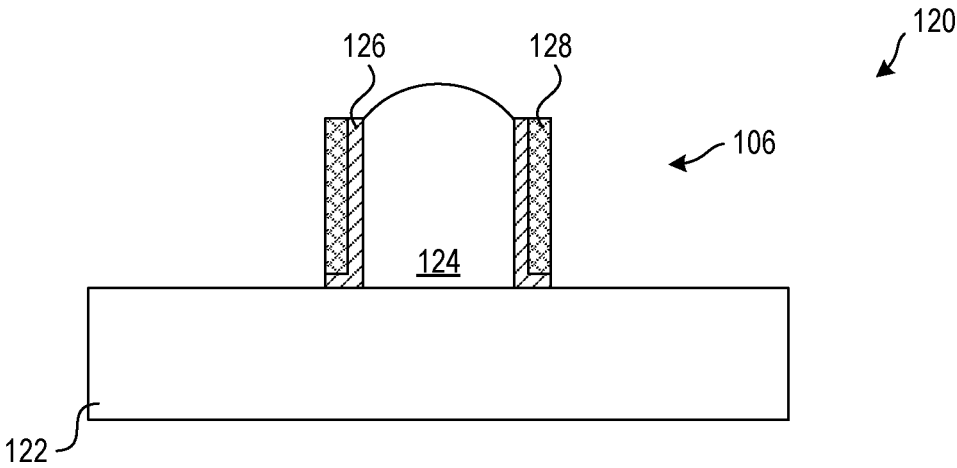

Before the first and second devices 110, 120 are coupled together and the interconnection structure 102 is formed, the first and/or second pillar 114, 124 can be substantially free of solder material on the bonding surfaces thereof. That is, for example, the interconnection structure portions 104, 106 can respectively include solder material only on the exterior surfaces of the first and second annular barrier layers 116, 126. For example, the first and/or second annular solder layers 118, 128 can each respectively have a top surface at the bonding surface edge of the first and second pillar 114, 124 bonding surfaces (as illustrated in FIGS. 8A, 8B). Additionally or alternatively, the top surface of the first and/or second annular solder layers 118, 128 can be coplanar with the top surface of the first and second annular barrier layers 116, 126, respectively (see FIGS. 8A, 8B). In some embodiments, the top surface of the first and/or second annular solder layers 118, 128 can be offset 1 μm, 5 μm, 10 or 20 μm (or any specific value or range outside or therebetween) below, or above and over, the top surfaces of the first and second annular barrier layers 116, 126, respectively. Similarly, the top surface of the first and/or second annular solder layers 118, 128 can be offset 1 μm, 5 μm, 10 μm, or 20 μm, (or any specific value or range outside or therebetween) below the bonding surface edges of the first and second pillars 114, 124, respectively.

The first and second pillars 114, 124 can include any suitable conductive material such as, for example, copper, gold, silver, aluminum, tungsten, cobalt, nickel, indium, or any other suitable conductive, eutectic material or combination thereof. In some embodiments, the first and second pillars 114, 124 can include the same material. In some embodiments, the first and second pillars 114, 124 can include different materials. The first and second annular barrier layers 116, 126 can include any suitable dielectric, nonconductive material such as, for example, a polymer, or other suitable similar material. Such suitable materials can prevent pre-assembly mixing of the first and second annular solder layers 118, 128 with the first and second pillars 114, 124, respectively. The first and second annular solder layers 118, 128 can include any suitable solder material that (i) can bond with the first and second annular barrier layers 116, 126, respectively, (ii) can flow from the outside of the interconnection structure 102 toward the interface of the first and second pillars 114, 124, and/or (iii) can form an intermetallic material between the bonding surfaces. For example, suitable solder materials can include tin, silver, copper, bismuth, indium, zinc, antimony, or any other eutectic material, or a combination thereof.

In some embodiments, the bonding surfaces of the first and/or second pillars 114, 124 can have corresponding respective concave and convex surfaces. For example, the bonding surfaces can have corresponding respective concave and convex hemispheric (e.g., constant radius-of-curvature) surfaces (e.g. full hemispheric surfaces); partial-hemispheric surfaces (e.g., as illustrated in FIG. 1, less than a hemisphere); full- or partial-hemielipsoid (e.g., with varying radius-of-curvature) surfaces (e.g., half, or less than half, of an ellipsoid); stepped or tiered surfaces; non-uniform, rounded surfaces; or any similar corresponding concave and convex surfaces. In some embodiments, both the first and second pillars 114, 124 can have convex bonding surfaces. As used herein regarding the concave and convex bonding surfaces, "corresponding surfaces" means surfaces that have substantially similar contours (e.g., shape) such that, when placed in contact and where vertically opposing, the convex surface can seat within the concave surface with a substantial portion (e.g., more than 25%, more than 33%, more than 40%), a majority (e.g., 50%), or even more (e.g., 66%, 75%, 90%, etc.) of the convex surface in contact with the concave surface.

In some embodiments, the bonding surfaces of the first and second pillars 114, 124 can have non-corresponding surfaces. For example, the bonding surface of first and second pillars 114, 124 can each have a partial-hemispheric surface. However, when the bonding surfaces interface, a gap may exist between the edges of the bonding surfaces. That is, although the lowermost portion of the first pillar 114 bonding surface and the uppermost portion of the second pillar 124 bonding surface can touch, the bonding surface edges may not. Additionally or alternatively, the bonding surfaces of the first and second pillars 114, 124 can have non-corresponding, non-identical surfaces. For example, the first pillar 114 bonding surface can have a partial-hemispheric surface and the second pillar 124 bonding surface can have a partial-hemielipsoid surface.

In some embodiments, the first and/or second pillars 114, 124 can have a cylindrical shape with uniform, circular cross section. In some embodiments, the first and/or second pillars 114, 124 can have non-cylindrical shapes and/or non-uniform, circular cross sections. In some embodiments, the first and second pillars 114, 124 can respectively extend from the first and second substrates 112, 122 a same distance (e.g., the first and second pillars 114, 124 have a same height). Alternatively, the first or second pillar 114, 124 can respectively extend from the first or second substrate 112, 122 a greater distance than the opposing pillar.

In some embodiments, the first and/or second annular barrier layers 116, 126 can respectively form a uniform layer over (e.g., uniform layer thickness along a length of) the first and second pillars 114, 124. In some embodiments, the first and/or second annular barrier layers 116, 126 can respectively form a non-uniform layer over the first and second pillars 114, 124. In some embodiments, the first and/or second annular solder layers 118, 128 can respectively form a uniform layer over the first and second annular barrier layers 116, 126. In some embodiments, the first and/or second annular solder layers 118, 128 can respectively form a non-uniform layer over the first and second annular barrier layers 116, 126. For example, a portion of the first and/or second annular solder layers 118, 128 can be thicker proximate to the bonding surface of the first and second pillars 114, 124, respectively. Further, for example, either or both of the first and/or second annular barrier layer 116, 126 and the first and/or second annular solder layers 118, 128 can have an annular frustum shape (upright or inverted).

Figure 2:
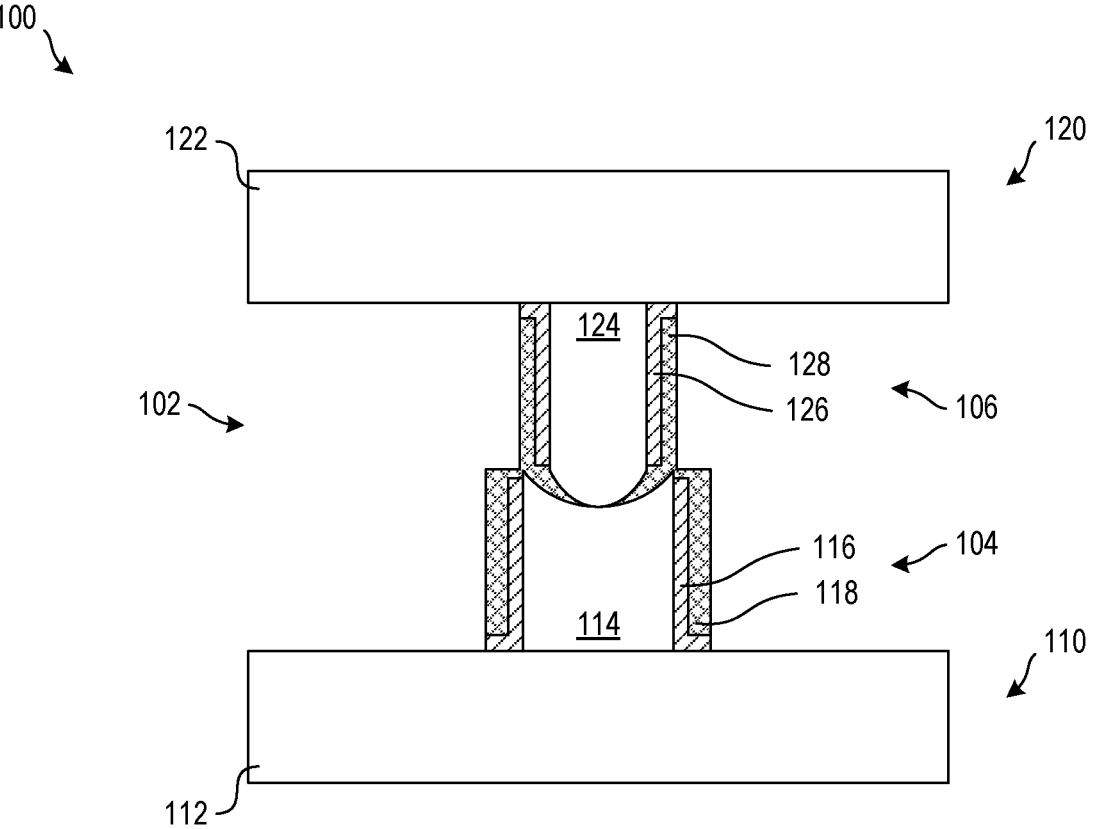
FIG. 2 is a cross sectional side view of a semiconductor device assembly, configured in accordance with some embodiments of the present technology.

FIG. 2 is a cross sectional side view of the assembly 100 including an interconnection structure 102 with outside solder material and varied size interconnection structure portions 104, 106, configured in accordance with some embodiments of the present technology. As shown in FIG. 2, the second diameter of the second pillar 124 can be smaller (e.g., 1%, 5%, 20%, 50%, or 90%, or any specific value or range outside or therebetween) than the first diameter of the first pillar 114. Further, the interconnection structure 102 can include a vertical and/or lateral gap between the bonding surface and edge of the second pillar 124 and the bonding surface and edge of the first pillar 114. When the assembly 100 includes first and second pillars 114, 124 with differing first and second diameters, portions of the first and/or second annular solder layer 118, 128 can extend over the first and/or second annular barrier layers 116, 126, respectively, and between the first and second pillars 114, 124. During an assembly process, solder material from the first and/or second annular solder layer 118, 128 can respectively flow from the outside of the first and second pillars 114, 124 toward the bonding surfaces thereof. In some embodiments, the first diameter of the first pillar 114 can be smaller than the second diameter of the second pillar 124.

In embodiments where the first and second diameters vary, the first pillar 114 bonding surface and the second pillar 124 bonding surface can, or cannot, have corresponding surfaces. For example, the first pillar 114 bonding surface can rest and seat on the second pillar 124 bonding surface. As a further example, and as illustrated in FIG. 2, there can be a gap between the first pillar 114 bonding surface edge and the second pillar 124 bonding surface; or there can be a gap between the second pillar 124 bonding surface edge and the first pillar 114 bonding surface.

Figure 9:
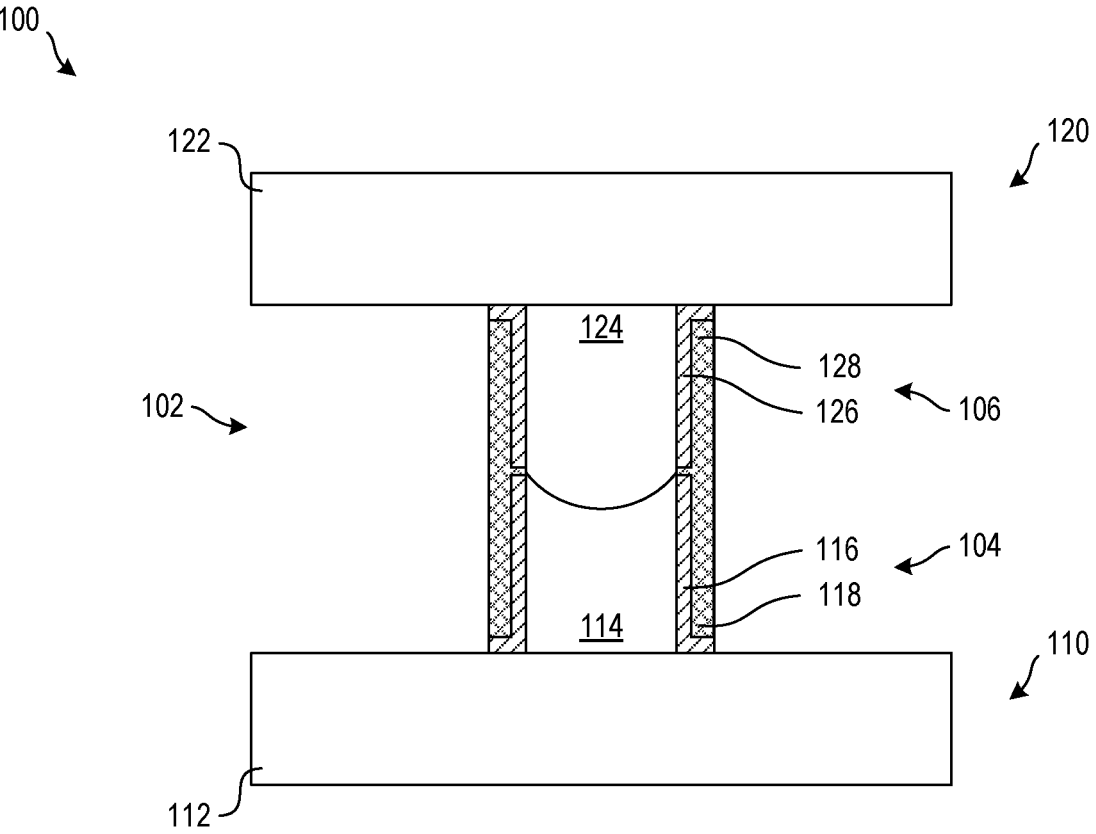

FIGS. 3-9 illustrate a process for producing the assembly 100 including the interconnection structure 102, in accordance with some embodiments of the present technology. The process can include: (i) forming a pillar blank 300 (FIG. 3), (ii) forming a dielectric layer 400 (FIG. 4), (iii) forming a patterned photoresist layer 500 (FIG. 5), (iv) forming a solder layer 600 (FIG. 6), (v) forming the bonding surfaces of the first and second pillars 114, 124 (FIGS. 7A, 7B), (vi) removing the patterned photoresist layer 500 (FIGS. 8A, 8B), and (vii) coupling the first and second devices 110, 120 together (FIG. 9). The process illustrated by FIGS. 3-9 is intended for illustrative purposes and is non-limiting. In some embodiments, the process can be accomplished with one or more additional operations not shown, without one or more of the operations described, or with operations described and/or not described in an alternative order.

For ease of illustrations, the first and second devices 110, 120, and the substrates 112, 122 thereof, are shown as a single component in FIGS. 3-6. It is understood that the operations illustrated by FIGS. 3-6 can be performed on independent components. Further, for ease of description, the following details regarding operations illustrated by FIGS. 3-6 are made only with reference to the first device 110. It is understood the same or similar operations can be performed regarding the second device 120.

Figure 3:
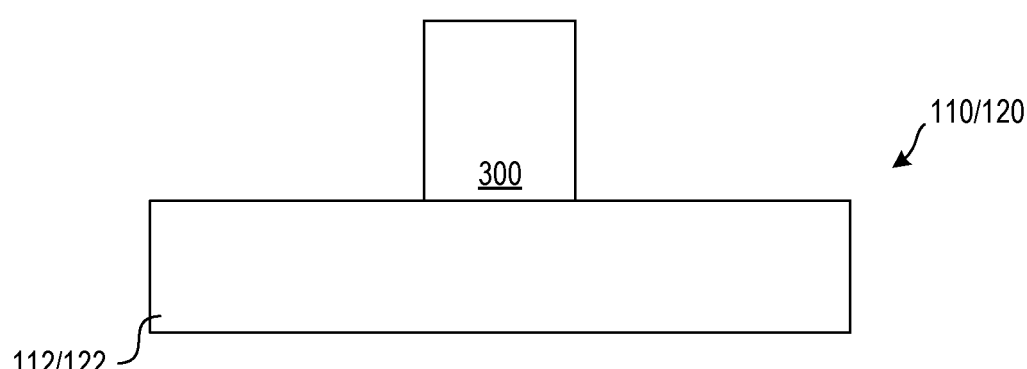
FIGS. 3-9 illustrate a process for producing a semiconductor device assembly, in accordance with some embodiments of the present technology.

FIG. 3 illustrates a side cross sectional view of the first device 110 after forming the pillar blank 300 on a surface of the substrate 112. As shown, the pillar blank 300 is a metallic column (e.g., a cylinder) formed on the surface of the substrate 112. The pillar blank 300 can be formed on and/or within the substrate 112 using any suitable additive manufacturing process including, for example, sputtering, physical vapor deposition (PVD), electroplating, lithography, or any other similar process. In some embodiments, the forming process can also include masking (e.g., dielectric, photoresist material) and/or etching processes.

Figure 4:
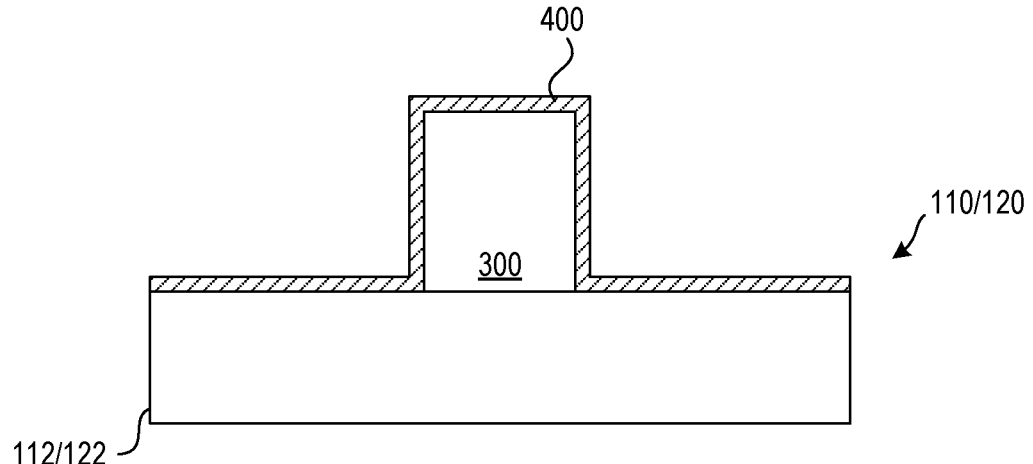

FIG. 4 illustrates a side cross sectional view of the first device 110 after forming the dielectric layer 400 over the substrate 112 and the pillar blank 300. As shown, the dielectric layer 400 is a nonconductive layer over the top surface of the substrate 112, and over a top surface and side surfaces of the pillar blank 300. The dielectric layer 400 can be formed using any suitable additive manufacturing and/or coating process.

Figure 5:
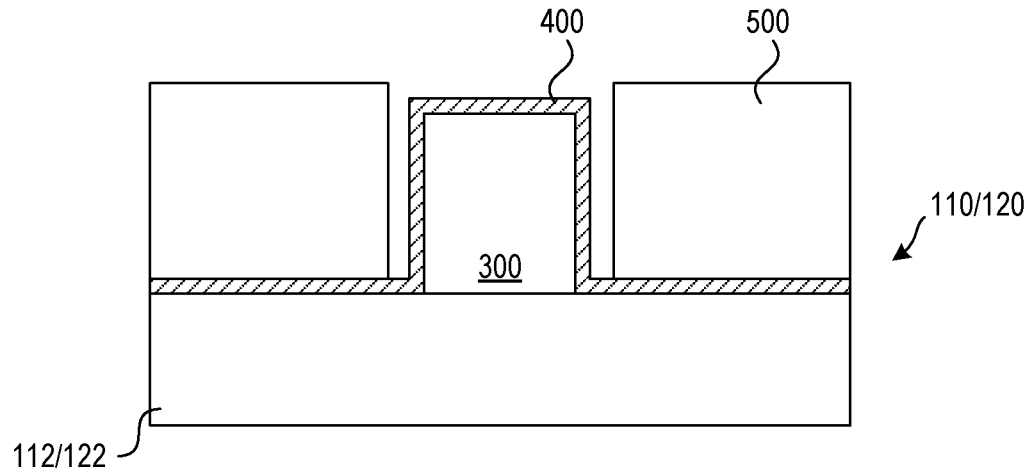

FIG. 5 illustrates a side cross sectional view of the first device 110 after forming the patterned photoresist layer 500 over the dielectric layer 400 above the substrate 112 and laterally spaced from the pillar blank 300. As shown, the photoresist layer 500 is patterned to provide an opening surrounding the dielectric layer 400 above the substrate 112. The opening can include a portion for forming the first annular solder layer 118 of FIG. 1 between an inner surface of the photoresist layer 500 (e.g., facing the pillar blank 300) and an outer surface of the dielectric layer 400 above the substrate 112 and over the pillar blank 300. The opening can further include a portion for forming solder material over the outer surface of the dielectric layer 400 above the pillar blank 300. The photoresist layer 500 can be formed using any suitable additive manufacturing and/or coating process. The opening can be maintained by selectively stopping photoresist layer 500 formation surrounding the pillar blank 300. Alternatively, the opening can be formed by applying the photoresist layer 500 to the dielectric layer 400 over the first device 110 and the pillar blank 300, and then selectively etching portions of the photoresist layer 500 from over and surrounding the pillar blank 300.

Figure 6:
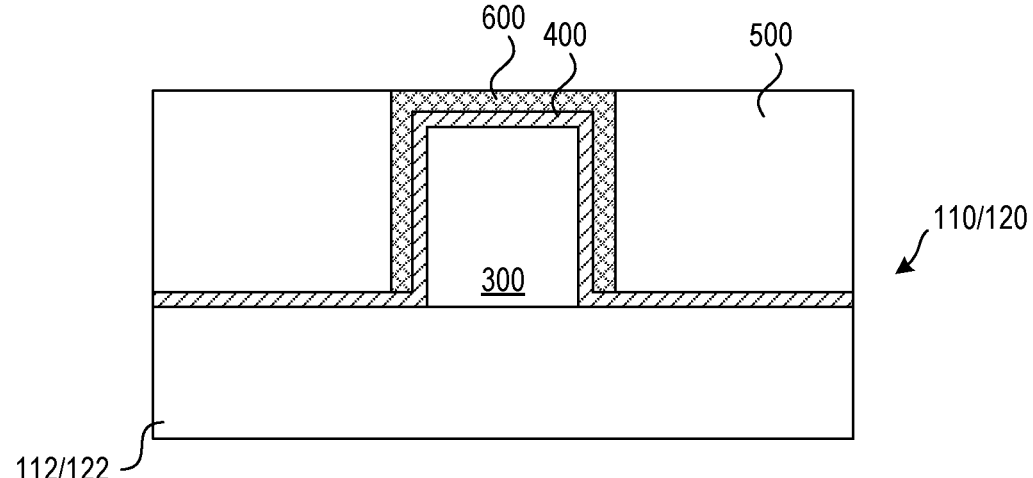

FIG. 6 illustrates a side cross sectional view of the first device 110 after forming the solder layer 600 within the photoresist layer 500 opening and over the pillar blank 300. As shown, the solder layer 600 fills the opening, extending from the dielectric layer 400 at a base of the opening (e.g., the first annual barrier layer 116 flange of FIG. 1) and over the dielectric layer 400 above the pillar blank 300. When the solder layer 600 is formed, the dielectric layer 400 can separate the solder material from the pillar blank 300, preventing the solder material from interacting (e.g., forming intermetallic material) with the pillar blank 300. In some embodiments, the dielectric layer 400 at the base of the opening can be removed, re-exposing the substrate 112, prior to forming the solder layer 600. In these embodiments, the solder layer 600 can instead extend from the substrate 112. Although as illustrated, the solder layer 600 extends over the dielectric layer 400 above the pillar blank 300, in some embodiments, a top surface of the solder layer 600 can instead be flush with a top surface of the dielectric layer 400 and/or a top surface of the pillar blank 300. The solder layer 600 can be formed using an additive manufacturing process including, for example, plating, depositing, or any other similar suitable method.

Figure 7A:
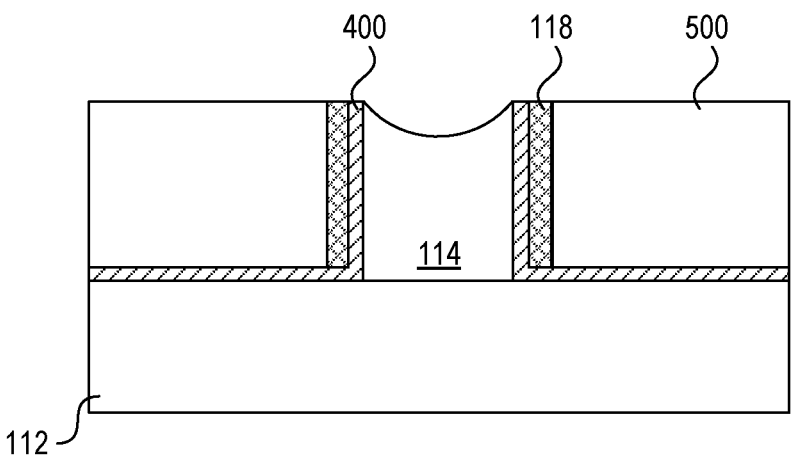
Figure 7B:
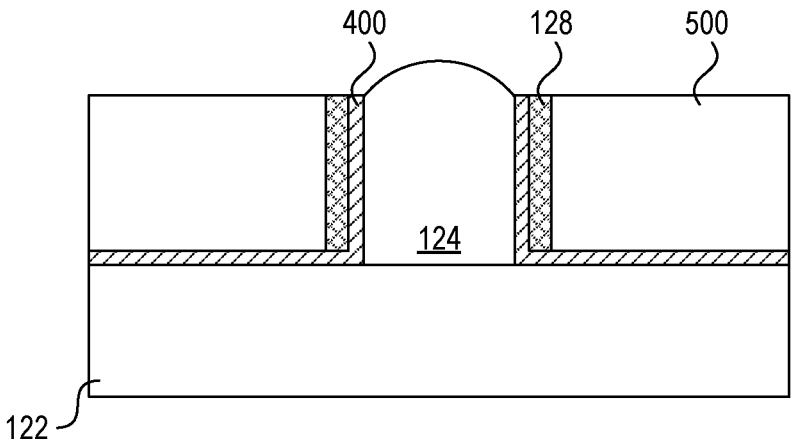

FIGS. 7A and 7B illustrate side cross sectional views of the first and second devices 110, 120 after forming the respective concave and convex bonding surfaces of the first and second pillars 114, 124. As shown in FIG. 7A, top portions of the pillar blank 300, the dielectric layer 400, the patterned photoresist layer 500, and/or the solder layer 600 can be removed to form (i) the first pillar 114 and the concave bonding surface thereof, (ii) the top surface of the first annular barrier layer 116 of FIG. 1, and/or (iii) the first annular solder layer 118. When the first device 110 includes the top surfaces of the first annular barrier layer 116 and/or of the first annular solder layer 118 above or below the bonding surface edge of the first pillar 114, the top portions of the dielectric layer 400 and/or the solder layer 600 can further, or lesser, be removed accordingly. The top portions of the pillar blank 300, the dielectric layer 400, the patterned photoresist layer 500, and/or the solder layer 600 can be removed using any suitable process including, for example, etching.

As a further example, the top portions of the pillar blank 300, the dielectric layer 400, the patterned photoresist layer 500, and/or the solder layer 600 can be removed using a chemical-mechanical polishing (e.g., planarization; "CMP") operation to form the concave shape of the bonding surface. During the CMP operation, the concave shape of the bonding surface can be created by controlling the metallic (e.g., copper/nickel) removal rate by adjusting the polishing slurry composition, downforce (e.g., increasing), and/or similar operating characteristics to increase removal of the material forming the first pillar 114, relative to the material surrounding the first pillar 114.

As shown in FIG. 7B, top portions of the pillar blank 300, the dielectric layer 400, the patterned photoresist layer 500, and/or the solder layer 600 can be removed to form (i) the second pillar 124 and the convex bonding surface thereof, (ii) the top surface of the second annular barrier layer 126 of FIG. 1, and/or (iii) the second annular solder layer 128. When the second device 120 includes the top surfaces of the second annular barrier layer 126 and/or the annular solder layer 128 above or below the bonding surface edge of the second pillar 124, the top portions of the dielectric layer 400 and/or the solder layer 600 can further, or lesser, be removed accordingly. The top portions of the pillar blank 300, the dielectric layer 400, the patterned photoresist layer 500, and/or the solder layer 600 can be removed using any suitable process including, for example, etching.

As a further example, the top portions of the pillar blank 300, the dielectric layer 400, the patterned photoresist layer 500, and/or the solder layer 600 can be removed using a CMP operation to form the convex shape of the bonding surface. During the CMP operation, the convex shape of the bonding surface can be created by controlling the metallic removal rate by adjusting the polishing slurry composition, downforce (e.g., reducing), and/or similar operating characteristics to decrease removal of the material forming the second pillar 124, relative to the materials surrounding the second pillar 124.

FIGS. 8A and 8B illustrate side cross sectional views of the first and second devices 110, 120 with the first and second interconnection structure portions 104, 106 respectively formed thereon. The first and second interconnection structure portions 104, 106 can be formed by removing the patterned photoresist layers 500 and portions of the dielectric layers 400 thereunder. As shown in FIG. 8A, the first device 110 is free of the photoresist layer 500 (FIG. 7A) above the substrate 112 and surrounding the first interconnection structure portion 104. Therefore, the first annular solder layer 118 remains surrounding the first annular barrier layer 116, and the first annular barrier layer 116 remains surrounding the first pillar 114. As shown in FIG. 8B, the second device 120 is free of the photoresist layer 500 (FIG. 7B) above the substrate 122 and surrounding the second interconnection structure portion 106. Therefore, the second annular solder layer 128 remains surrounding the second annular barrier layer 126, and the second annular barrier layer 126 remains surrounding the second pillar 124. The photoresist layers 500, and the dielectric layers 400 thereunder, can be removed by etching above the substrates 112, 122 to re-expose the top surfaces thereof.

FIG. 9 illustrates a side cross sectional view of the assembly 100 after coupling the first and second devices 110, 120 together with the interconnection structure 102. As shown, the first pillar 114 and the second pillar 124 are aligned along central, vertical axes thereof, with the lowermost portion of the concave bonding surface contacting (e.g., interfacing with, touching) the uppermost portion of the convex bonding surface. Further, portions of the first and second annular solder layers 118, 128 have flown over the first and second annular barrier layers 116, 126, respectively, and between the concave and convex bonding surfaces. The interconnection structure 102 can directly physically and electrically couple the first and second devices 110, 120 together.

The first and second interconnection structures 104, 106 can undergo a reflow or similar operation (e.g., temperature compression bonding) to form the interconnection structure 102 coupling the first and second devices 110, 120 together. For example, the first and second devices 110, 120, with the first and second pillars 114, 124 aligned and touching, can be heated to reflow (e.g., at least partially liquefy) the first and/or second annular solder layers 118, 128. Portions of the partially liquefied first and/or second annular solder layers 118, 128 can then flow over the first and second annular barrier layers 116, 126, respectively, and between the first and second pillar 114, 124 bonding the surfaces together. In some embodiments, a compression force can be applied to press the first and second devices 110, 120 together during the assembly process.

FIG. 10 is a flow diagram illustrating a process 1000 for producing a semiconductor device assembly, in accordance with some embodiments of the present technology. For example, the process can be used to produce the assembly 100 of FIG. 1. The operations of process 1000 are intended for illustrative purposes and are non-limiting. In some embodiments, for example, the process 1000 can be accomplished with one or more additional operations not described, without one or more of the operations described, or with operations described and/or not described in an alternative order. As shown in FIG. 10, the process may include: providing a first semiconductor die with a first interconnection structure portion thereon, the first interconnection structure portion having a concave bonding surface (process portion 1002), providing a second semiconductor die with a second interconnection structure portion thereon, the second interconnection structure portion having a convex bonding surface (process portion 1004); aligning the first and second semiconductor dies with the concave bonding surface interfacing and opposing the convex bonding surface (process portion 1006), and coupling the first and second semiconductor dies together (process portion 1008).

In some embodiments, the process for producing the assembly may only include aligning and coupling first and second semiconductor dies together (process portions 1006, 1008). In these embodiments, the first and second interconnection structures can respectively be pre-formed on the first and second devices. That is, for example, one or more steps of the process 1000 can be performed by different organizations (e.g., by a supplier). In other embodiments, all steps of the process 1000 can be performed by the same organization (e.g., by a vertically-integrated company).

Providing the first semiconductor die with the first interconnection structure portion thereon (process portion 1002) can include using an additive process, including, for example, sputtering, PVD, electroplating, lithography, or another similar process to form a first semiconductor substrate. The first interconnection structure portion can then be formed using a combination of additive and removal process, including, for example, plating, depositing, etching, and/or any other suitable process. The first interconnection structure portion can include a first pillar extending from the first semiconductor substrate and having a concave bonding surface, a first annular barrier layer surrounding the first pillar, and a first annular solder layer surrounding the first annular barrier layer. In some embodiments, the first pillar can instead include a convex bonding surface. In some embodiments, the first interconnection structure portion can exclude the first annular barrier layer and/or the first annular solder layer.

Providing the second semiconductor die with the second interconnection structure portion thereon (process portion 1004) can include using an additive process, including, for example, sputtering, PVD, electroplating, lithography, or another similar process to form a second semiconductor substrate. The second interconnection structure portion can then be formed using a combination of additive and removal process, including, for example, plating, depositing, etching, and/or any other suitable process. The second interconnection structure portion can include a second pillar extending from the second semiconductor substrate and having a convex bonding surface. In some embodiments, the second interconnection structure portion can further include a first annular barrier layer surrounding the first pillar and a first annular solder layer surrounding the first annular barrier layer. In some embodiments, the second interconnection structure portion can include a concave bonding surface.

Aligning the first and second semiconductor dies with the concave bonding surface interfacing and opposing the convex bonding surface (process portion 1006) can include, for example, positioning the first semiconductor die over the second semiconductor die with the concave and convex bonding surfaces, respectively, opposing one another. The convex bonding surface can then be placed on the concave bonding surface. In some embodiments, the second semiconductor die can be positioned over the first semiconductor die with the convex and concave bonding surfaces, respectively, opposing one another. The concave bonding surface can then be placed on the convex bonding surface.

Coupling the first and second semiconductor dies together (process portion 1008) can include, for example, reflowing a portion of the first annular solder layer over the first annular barrier layer and between the concave and convex bonding surfaces. Reflowing can include combining heat and/or pressure (e.g., pressing the first semiconductor die against the second semiconductor device) to at least partially liquefy the first annular solder layer. The liquefied solder material can flow along a length the first interconnection structure portion toward the second interconnection structure portion and between the concave and convex bonding surfaces. The liquefied solder material and/or the heat and pressure can generate an intermetallic material between the bonding surfaces, including metallics from the first pillar, the second pillar, and/or the liquefied solder material. The intermetallic material can couple the first and second pillars together, forming the interconnection structure and coupling the first and second devices together. In embodiments where the second interconnection structure portion also includes a second annular barrier layer and a second annular solder layer, a portion of the second annular solder layer can also liquefy and flow between the concave and convex surfaces.

Any one of the semiconductor devices and/or semiconductor device assemblies described above with reference to FIGS. 1-10 can be incorporated into any of a myriad of larger and/or more complex systems, a representative example of which is system 1100 shown schematically in FIG. 11. The system 1100 can include a semiconductor device assembly 1102 (e.g., the assembly 100 of FIG. 1), a power source 1104, a driver 1106, a processor 1108, and/or other subsystems or components 1110. The semiconductor device assembly 1102 can include features generally similar to those of the semiconductor devices and assemblies described above with reference to FIGS. 1-10. The resulting system 1100 can perform any of a wide variety of functions, such as memory storage, data processing, or other suitable functions. Accordingly, representative systems 1100 can include, without limitation, hand-held devices (e.g., mobile phones, tablets, digital readers, and digital audio players), computers, vehicles, appliances, and other products. Components of the system 1100 may be housed in a single unit or distributed over multiple, interconnected units (e.g., through a communications network). The components of the system 1100 can also include remote devices and any of a wide variety of computer readable media.

Systems 1100 incorporating the semiconductor devices and/or semiconductor device assemblies described above with reference to FIGS. 1-10 can similarly benefit from including solder material on an outside of interconnection structures therein and excluding—before assembly—solder material between interconnection structure pillars bonding surfaces of semiconductor devices. For example, including such interconnection structures can reduce or eliminate solder and/or intermetallic voiding between pillars, or similar structures, of coupled semiconductor devices. Similarly, solder squeeze-out from between pillars or similar structures (e.g., solder exiting from between pillars and wrapping round the edges thereof) can be reduced or eliminated for the same reason. Further, including such interconnection structures can alleviate semiconductor device assembly issues related to assembly and/or sub-component height. For example, device assembly height controls can be less critical while a device assembly height can be more accurate. Similarly, pillar heights can have a greater acceptance window (e.g., pillar height mis-match can be greater).

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Additionally, the terms "comprising," "including," "having," and "with" are used throughout to mean including at least the recited feature or features such that any greater number of the same features and/or additional types of other features are not precluded.

As used herein, including in the claims, "and/or" as used in a list of items (e.g., a list of items prefaced by a phrase such as "at least one of" or "one or more of") indicates an inclusive list such that, for example, a list of at least one of A, B, and/or C means A or B or C, or AB or AC or BC, or ABC (i.e., A and B and C). Also, as used herein, the phrase "based on" shall not be construed as a reference to a closed set of conditions.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature, and/or positioned further from another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:

a first semiconductor die;

a second semiconductor die; and an interconnection structure directly electrically coupling the first and the second semiconductor dies, the interconnection structure including:

a first interconnection structure portion at the first semiconductor die, the first interconnection structure portion having:

a first conductive pillar with a concave bonding surface, a first annular barrier layer circumferentially surrounding a sidewall of the first conductive pillar, and a first annular solder layer circumferentially surrounding the first annular barrier layer and the sidewall of the first conductive pillar, and a second interconnection structure portion at the second semiconductor die, the second interconnection structure portion having a second conductive pillar with a convex bonding surface coupled to the concave bonding surface.

2. The semiconductor device assembly of claim 1, wherein the second interconnection structure further includes:

a second annular barrier layer surrounding a sidewall of the second conductive pillar, and a second annular solder layer surrounding the second annular barrier layer.

3. The semiconductor device assembly of claim 1, wherein the interconnection structure further includes an intermetallic material adjacent to the concave bonding surface and the convex bonding surface.

4. The semiconductor device assembly of claim 3, wherein the intermetallic material is substantially free of voiding in a central region vertically aligned with centers of the first and second conductive pillars.

5. The semiconductor device assembly of claim 1, wherein the first conductive pillar has a first diameter, wherein the second conductive pillar has a second diameter, and wherein the first diameter is different than the second diameter.

6. The semiconductor device assembly of claim 1, wherein the concave bonding surface has a first constant radius of curvature.

7. The semiconductor device assembly of claim 1, wherein the convex bonding surface has a second constant radius of curvature different than the first constant radius of curvature.

8. The semiconductor device assembly of claim 1, wherein the first conductive pillar extends a first distance from the first semiconductor die, wherein the second conductive pillar extends a second distance from the second semiconductor die, and wherein the first distance is different than the second distance.

9. The semiconductor device assembly of claim 1, wherein the interconnection structure is one of a plurality of substantially identical interconnection structures directly electrically coupling the first and second semiconductor dies.

10. The semiconductor device assembly of claim 1 further comprising a third semiconductor die and a second interconnection structure, wherein the second interconnection structure directly electrically couples the first and third semiconductor dies, and wherein the second interconnection structure includes:

a third interconnection structure portion identical to the first interconnection structure portion and extending from; and a fourth interconnection structure portion identical to the second interconnection structure portion.

11. A semiconductor device, comprising:

a semiconductor substrate; and an interconnection structure extending from the semiconductor substrate, the interconnection structure including:

a conductive pillar having a curved bonding surface opposite the semiconductor substrate, an annular barrier layer surrounding a sidewall of the conductive pillar, and an annular solder layer surrounding the annular barrier layer and the sidewall of the conductive pillar;

wherein the curved bonding surface is substantially free of solder material.

12. The semiconductor device of claim 11, wherein a top surface of the annular barrier layer is at an edge of the curved bonding surface.

13. The semiconductor device of claim 11, wherein the annular solder layer extends from the semiconductor substrate to an edge of the curved bonding surface.

14. The semiconductor device of claim 11, wherein a top surface of the annular solder layer is below a top surface of the annular barrier layer.

15. The semiconductor device of claim 11, wherein the curved bonding surface has a constant radius of curvature.

16. The semiconductor device of claim 11, wherein the curved bonding surface is convex.

17. The semiconductor device of claim 11, wherein the conductive pillar has a circular cross section.

18. The semiconductor device of claim 11 further comprising a second interconnection structure extending from the semiconductor substrate, the second interconnection structure including:

a second conductive pillar having a curved bonding surface opposite the semiconductor substrate;

a second annular barrier layer surrounding a sidewall of the conductive pillar; and a second annular solder layer surrounding the annular barrier layer;

wherein the curved bonding surface is substantially free of solder material.

19. A method of manufacturing a semiconductor die interconnection structure, the method comprising:

providing a first semiconductor die with a first interconnection structure portion thereon, the first interconnection structure portion including:

a first conductive pillar with a concave bonding surface, a first annular barrier layer surrounding the first pillar, and a first annular solder layer surrounding the first annular barrier layer and a sidewall of the conductive pillar;

providing a second semiconductor die with a second interconnection structure portion thereon, the second interconnection structure portion including a convex bonding surface;

aligning the first and second semiconductor dies with the concave bonding surface interfacing and opposing the convex bonding surface; and coupling the first and second semiconductor dies together by flowing a portion of the first annular solder layer over the first annular barrier layer and between the concave and convex bonding surfaces.

20. The method of claim 19, wherein the second semiconductor die further comprises (i) a second conductive pillar having the convex bonding surface, (ii) a second annular barrier layer surrounding the second conductive pillar, and (iii) a second annular solder layer surrounding the second annular barrier layer, and wherein coupling further includes reflowing a portion of the second annular solder layer over the second annular barrier layer and between the concave and convex bonding surfaces.

* * * * *